(12) United States Patent
Duong et al.

(10) Patent No.: US 9,281,973 B2
(45) Date of Patent: Mar. 8, 2016

(54) METHOD FOR DEMODULATING AT LEAST ONE FRAME CONSISTING OF A SUCCESSION OF BITS CODED ACCORDING TO A MANCHESTER CODE

(71) Applicant: SAGEM DEFENSE SECURITE, Boulogne-Billancourt (FR)

(72) Inventors: Thanh-Truoc Duong, Boulogne-Billancourt (FR); Frédéric Bocage, Boulogne-Billancourt (FR)

(73) Assignee: SAGEM DEFENSE SECURITE, Boulogne-Billancourt (FR)

( * ) Notice: Subject to any disclaimer, the term of this patent is extended or adjusted under 35 U.S.C. 154(b) by 0 days.

(21) Appl. No.: 14/650,604

(22) PCT Filed: Dec. 11, 2013

(86) PCT No.: PCT/EP2013/076180
§ 371 (c)(1),
(2) Date: Jun. 9, 2015

(87) PCT Pub. No.: WO2014/090854
PCT Pub. Date: Jun. 19, 2014

(65) Prior Publication Data
US 2015/0304140 A1 Oct. 22, 2015

(30) Foreign Application Priority Data
Dec. 14, 2012 (FR) ...................... 12 62059

(51) Int. Cl.
*H03D 3/22* (2006.01)
*H04L 27/22* (2006.01)
(Continued)

(52) U.S. Cl.
CPC .............. *H04L 25/4904* (2013.01); *H03M 5/12* (2013.01); *H04L 1/0047* (2013.01)

(58) Field of Classification Search
CPC ..... H04L 25/4904; H04L 1/0047; H03M 5/12
USPC ............................ 375/333, 282, 361; 341/70
See application file for complete search history.

(56) References Cited

U.S. PATENT DOCUMENTS 4,185,273 A * 1/1980 Gowan ............... G11B 20/1419
341/70
4,807,260 A * 2/1989 Solina ..................... H03M 5/12
375/333

(Continued)

FOREIGN PATENT DOCUMENTS

EP 0 377 335 A2 7/1990

OTHER PUBLICATIONS

Mar. 6, 2014 Search Report issued in International Application No. PCT/EP2013/076180.

*Primary Examiner* — Phuong Phu
(74) *Attorney, Agent, or Firm* — Oliff PLC (57) ABSTRACT

A method for demodulating at least one received frame is provided, where the frame includes of a succession of bits coded according to a Manchester code. The method includes the steps of: generating an interruption at least at each appearance of a rising and/or falling edge of the frame of coded bits; determining the time between each interruption from at least one first counter; reinitializing the demodulation of the frame as soon as one of the determined times is less than a first predetermined value or greater than a second predetermined value, the first and second predetermined values being dependent on the duration of a bit coded according to the code; and demodulating, for each determined time, if the determined time is greater than the first predetermined value and is less than the second predetermined value, at least one binary value of the frame from the determined time.

11 Claims, 4 Drawing Sheets

(51) Int. Cl.
  *H04L 25/49* (2006.01)
  *H03M 5/12* (2006.01)
  *H04L 1/00* (2006.01)

(56) References Cited

U.S. PATENT DOCUMENTS

| | | | |
|---|---|---|---|
| 5,023,891 A * | 6/1991 | Johnson, III | H03M 5/12 341/70 |
| 5,185,766 A * | 2/1993 | Cho | H04L 25/4904 329/313 |
| 5,748,123 A * | 5/1998 | Lee | H03M 5/145 341/50 |
| 6,977,973 B1 | 12/2005 | Wiggins | |
| 2007/0195911 A1* | 8/2007 | Ochi | H04L 25/4904 375/324 |
| 2007/0248180 A1 | 10/2007 | Bowman et al. | |
| 2008/0266068 A1 | 10/2008 | Farrell et al. | |

* cited by examiner

METHOD FOR DEMODULATING AT LEAST ONE FRAME CONSISTING OF A SUCCESSION OF BITS CODED ACCORDING TO A MANCHESTER CODE

The present invention concerns a method and device for demodulating at least one received frame, the frame consisting of a succession of bits coding according to a Manchester code.

The Manchester code, whether or not it is differential, is a code in which the value of a bit is encoded by a falling or rising edge.

In general the binary value and "0" is encoded by a falling edge and the binary value "1" is encoded by a rising edge.

The Manchester code is often used in data transmissions between a transmitter and receiver connected together by a capacitive or magnetic coupling.

The Manchester code is simple to implement but is sensitive to parasitic pulses that create rising or falling edges on the transmitted signal.

These parasitic pulses are for example created by parasitic electromagnetic and/or mechanical vibrations.

A conventional solution consists of adding, to the data frame transmitted, redundant data so as to correct any errors caused on decoding by the parasitic pulses or to add to the transmitted data frame parity data that make it possible to detect at least one error during decoding. In very noisy environments, it is then necessary to add a large quantity of redundant or parity data. This has the effect of increasing the size of the frame or reducing the quantity of useful data included in the frame if the size of the frame is fixed.

The aim of the present invention is to solve the drawbacks of the prior art by proposing a method and device for demodulating at least one frame consisting of a succession of bits coded according to a Manchester code that makes it possible to effectively detect any demodulation errors related to the presence of parasitic pulses in the received signal.

To this end, according to a first aspect, the invention proposes a method for demodulating a received frame, the frame consisting of a succession of a predetermined number of bits coded according to a Manchester code, characterised in that the method comprises the steps of:

generating an interruption at least at each appearance of a rising and/or falling edge of the frame of coded bits,
determining the time between each interruption from at least one first counter,
reinitialising the demodulation of the frame as soon as one of the determined times is less than a first predetermined value or greater than a second predetermined value, the first and second predetermined values being dependent on the duration of a bit coded according to the Manchester code,
demodulating, for each determined time, if the determined time is greater than the first predetermined value and is less than the second predetermined value, at least one binary value of the frame from the determined time and from a previously determined binary value.

The present invention also concerns a device for demodulating at least one received frame, the frame consisting of a succession of a predetermined number of bits coded according to a Manchester code, characterised in that the demodulation device comprises:

means for generating an interruption at least at each appearance of a rising and/or falling edge of the frame of coded bits,
means for determining the time between each interruption from at least one first counter,
means for reinitialising the demodulation of the frame as soon as one of the times determined with the first counter is less than a first predetermined value or greater than a second predetermined value, the first and second predetermined values being dependent on the duration of a bit coded according to the Manchester code,
means for demodulating, for each determined time, if the determined time is greater than the first predetermined value and is less than the second predetermined value, at least one binary value of the frame from the determined time and from a previously determined binary value.

Thus it is possible to effectively detect any demodulation errors related to the presence of parasitic pulses in the received signal. This is because a parasitic pulse during the reception of a frame invalidates the frame.

By reinitialising the demodulation as soon as a time determined with at least the first counter is less than a first predetermined value or greater than a second predetermined value, depending on the duration of a bit in the Manchester code, it is also possible to interrupt an attempt at demodulation of a parasitic pulse situated between two frames without disturbing the demodulation of the two frames.

According to a particular embodiment of the present invention, the binary value determined is dependent on the binary value previously determined.

According to a particular embodiment of the present invention, the method also comprises the step of reinitialising the decoding of the frame if the value of the second counter is higher than the second predetermined threshold.

According to a particular embodiment of the present invention, a predetermined number of frames are received, the frames being spaced apart in time and the demodulation device:

validates each received frame independently of the other frames, stores the received frame and validates and reinitialises the demodulation algorithm.

If a parasitic pulse arrives before the first pulse of the frame and with a time greater than the first predetermined value or greater than the second predetermined value, the present invention makes it possible to detect the parasitic pulse and to reinitialise the decoding so as to be ready to decode the frame.

In addition, since the communication is validated frame by frame, it is thus possible, for example when several parasitic pulses are present in the received signal, to receive a partial communication with some of the validated frames. The spacing in time between the various frames being defined by a duration greater than the maximum duration expected between two interruptions in the same frame, the demodulation algorithm is reinitialised by this dead time, which makes it possible to have an algorithm reinitialised at the start of the following frame, independently of the previous frame validation.

According to a particular embodiment, the frames comprise a label or are numbered.

This information makes it possible, in the case of partial recovery of the communication, that is to say in the case of a loss of frame caused by the presence of a parasitic pulse, to identify the frame correctly received and to correctly interpret the data received without data attribution error.

In addition, the present invention is particular well suited to configurations in which it is difficult to precisely predict the period of time within which a frame arrives.

The present invention does not require a time window restricting the moment at which the various times are received.

According to a particular embodiment of the invention, the demodulation device:

initialises a second counter when the first interruption is launched, checks, at each interruption, whether the value of the second counter is equal to a third predetermined threshold, the third predetermined threshold representing a maximum time for the decoding of all the frames, stops the demodulation of the frame if the value of the second counter is greater than the third predetermined threshold.

Thus the frames not received when the demodulation is stopped are considered to be invalid since the time necessary for reception of said frames is greater than the maximum time expected for reception of said frames.

According to a particular embodiment of the invention, the first counter is a cyclic counter asynchronous with the other counters, with a duration less than the duration of the reception of the frames, and a third counter counts the number of occasions when the capacity of the first counter is exceeded.

According to a particular embodiment of the invention, the third counter is reinitialised at each demodulation of at least one binary value.

Thus the time determined between each interruption and used for demodulating the frame is then corrected by the value of the third counter in order to take into account the cyclic aspect of the first counter.

Thus it is possible to use a counter intended for other tasks, and the cost of producing the device or implementing the method according to the present invention is reduced.

According to a particular embodiment of the invention, each frame also comprises information for verifying whether the bits of a decoded frame have been correctly decoded.

Thus a parasitic pulse arrives before the first pulse of the frame and with a time less than the first predetermined value, and the frame will be invalidated by the traditional mechanisms of protecting a communication, of the parity or CRC (cyclic redundancy check) type.

According to a particular embodiment of the invention, the edge is a falling edge.

The features of the invention mentioned above, as well as others, will emerge more clearly from a reading of the following description of an example embodiment, said description being given in relation to the accompanying drawings, among which.

The frame demodulation device 10 is suitable for performing, using one or more software modules, the steps of the algorithm as described with reference to FIGS. 2a, 2b and 2c.

Figure 1:
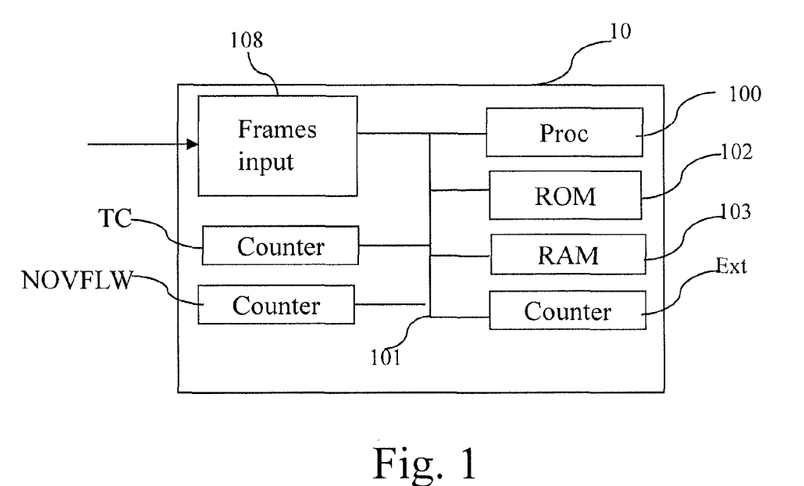
FIG. 1 depicts an example embodiment of a frame demodulation device according to the present invention.

The frame demodulation device 10 comprises a communication bus 101 to which there are connected a processor 100, a non-volatile memory 102, a random access memory 103 and three counters, a first counter Tc, a second counter Ext and a third counter NOVFLW.

The non-volatile memory 102 stores the software module or modules implementing the invention, as well as the data for implementing the algorithms as described with reference to FIGS. 2a to 2c.

More generally, the programs according to the present invention are stored in a storage means. This storage means is read by the microprocessor 100. This storage means is integrated or not in the frame demodulation device 10 and may be removable.

When the frame demodulation device is powered up, the software module or modules according to the present invention is or are transferred into the random access memory 103, which then contains the executable code according to the present invention as well as the data necessary for implementing the invention.

The first counter TC is a sixteen-bit cyclic counter that counts from zero to FFFF in hexadecimal over a period of around 118 ms. The counter TC is reinitialised to zero when the value FFFF is reached and automatically recommences counting.

The third counter NOVFLW counts each time the counter TC arrives at the value FFFF. The counter NOVFLW is reinitialised to zero on instruction from the processor 100. It should be noted here that the counter NOVFLW is here in the form of a component but the counter NOVFLW may in a variant be implemented in software form.

The counters TC and NOVFLW make it possible to determine whether the time between two consecutive interruptions is not greater or less than what it should be in a functioning without parasitic pulses in the signal.

It should be noted here that the values of the counters NOVFLW and TC are determined according to the application in which the present invention is implemented.

The second counter Ext is for example initialised to a predetermined value and counts down until it reaches zero. The counting down between the predetermined value and zero is done over a period of around two hundred milliseconds, which represents the maximum duration allocated to the reception of the various frames.

The parameters of the counter Ext make it possible to define the maximum time for the decoding of the bit frames received.

The frame input interface 108, for example at each falling edge of the binary signal received, generates an interruption intended for the processor 100.

In a variant, the frame input interface 108 generates an interruption intended for the processor 100 at each rising edge of the binary signal received.

In a variant, the frame input interface 108 generates an interruption intended for the processor 100 at each edge of the binary signal received.

It should be noted here that the frame demodulation device 10 may consist of one or more electronic components.

Figure 2A:
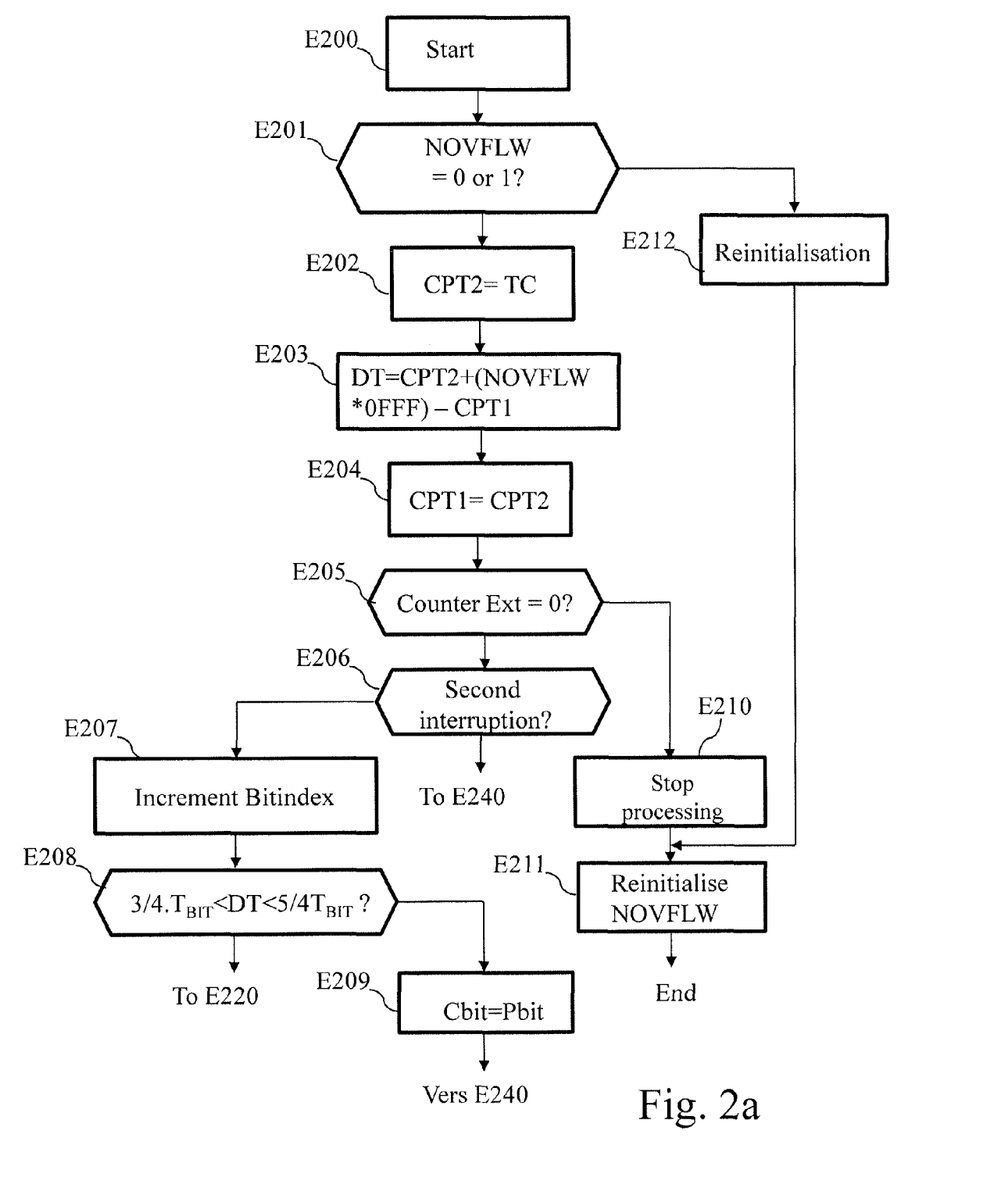
FIGS. 2a to 2c depict a frame demodulation algorithm according to the present invention.
Figure 2B:
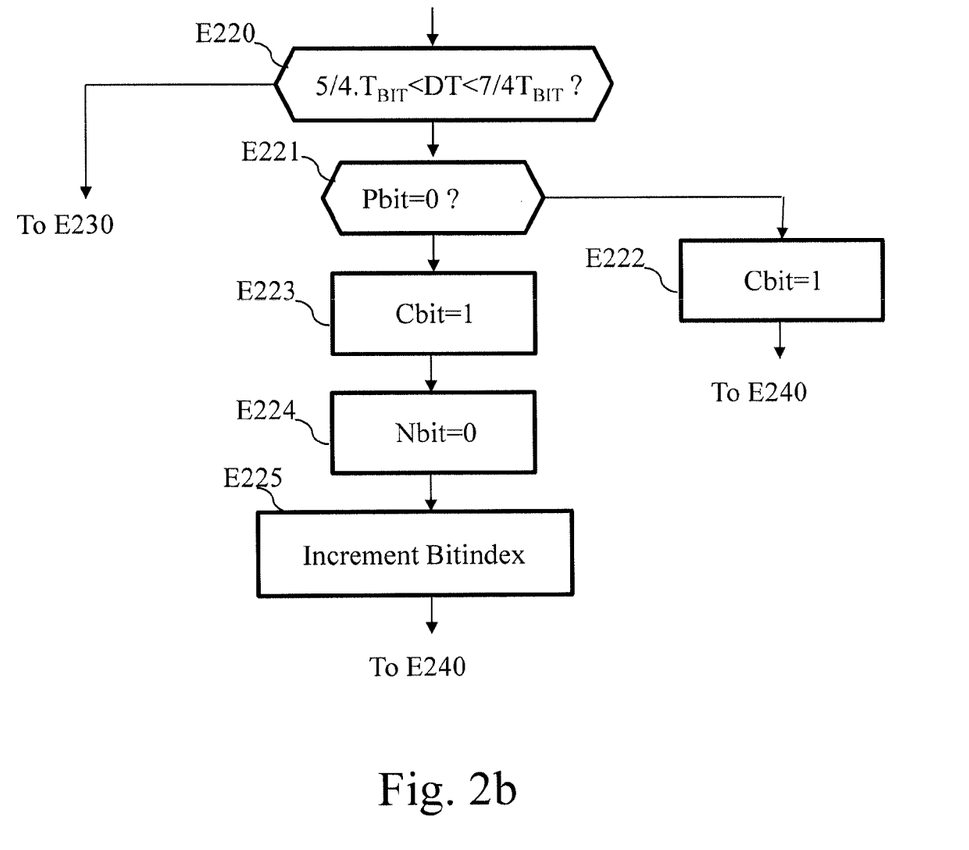
Figure 2C:
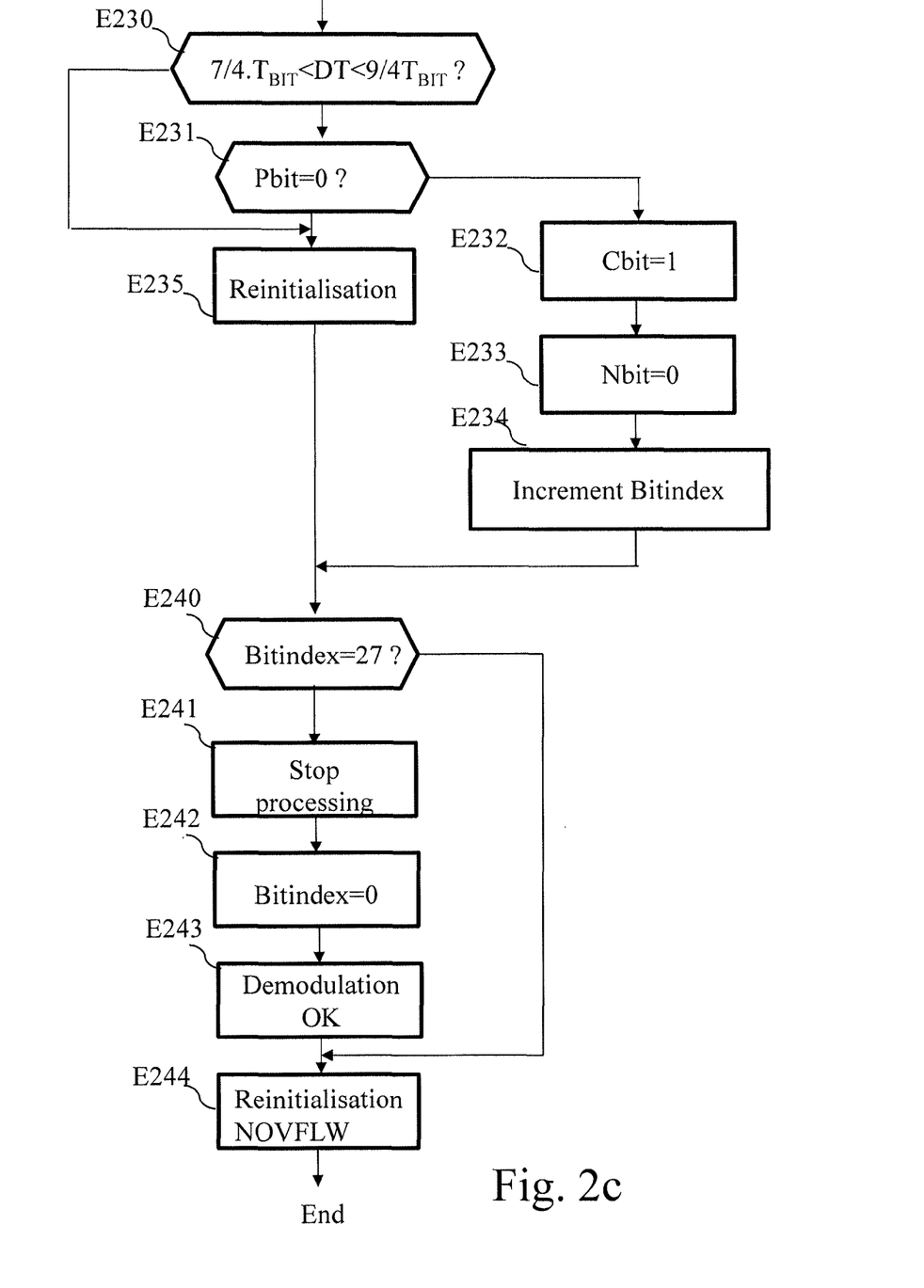

FIGS. 2a to 2c depict a frame demodulation algorithm according to the present invention.

More precisely, the present algorithm is executed by the processor 100 of the frame demodulation device 10.

The present algorithm is described in an example embodiment in which the interruptions are generated at each falling edge of the received signal.

A person skilled in the art will derive from the teaching of the present example embodiment the teachings necessary for implementing the present invention when the interruptions are generated at each rising edge of the binary signal received or at each rising or falling edge of the binary signal received.

The modulated frames according to the present invention are, in a particular example embodiment, a series of three frames consisting of 28 bits encoded with a Manchester code. The first bit of each frame is at the zero value, and the following two bits make it possible to identify each of the frames, 00 for the first frame, 01 for the second and 10 for the third frame.

The following 24 bits are binary data and the last bit is a parity bit that makes it possible to detect whether an error exists in the demodulation of the frame.

A bit time is equal to 256 microseconds, and each frame has a duration of 7.168 ms and is separated by a time of around 16 ms.

At step E200, the processor 100 detects an interruption generated by the frame input module 108 and increments a variable Intc by one unit.

At the following step E201, the processor 100 checks whether the value of the counter NOVFLW is zero or equal to one.

If the value of the counter NOVFLW is zero or equal to one, the processor 100 passes to step E202. If the value of the counter NOVFLW is equal to or greater than 2, the processor 100 passes to step E212. If the value of the counter NOVFLW is equal to or greater than 2, the time between the two interruptions is greater than the maximum duration between two interruptions generated by the data coded according to the Manchester code.

At step E202, the processor 100 sets the variable CPT2 to the value of the counter TC.

At the following step E203, the processor 100 calculates the value of the variable DT with the following formula DT=CPT2+(NOVFLW*FFFF)−CPT1.

NOVFLW is the value of the counter NOVFLW, FFFF is expressed in hexadecimal and CPT1 is a variable. This calculation makes it possible to take into account the actual duration between the two interruptions with the taking into account of the cyclic counting of the counter TC. It should be noted here that the count Ext is completely asynchronous, and the exceeding of the first counter TC can potentially be reached between two.

At the following step E204, the processor 100 sets the value of the variable CPT1 to the value of CPT2.

The value of the variable CTT1 will, when the present algorithm is next executed, represent the instant when the previous interruption was detected.

At the following step E205, the processor 100 checks whether the counter Ext is at zero. If the counter Ext is at zero, the maximum time allocated to the communication has been reached.

If the counter Ext is at zero, the processor 100 passes to step E210. If not, the processor 100 passes to step E206.

At step E206, the processor 100 checks whether the variable Intc is greater than unity.

If the variable Intc is greater than unity, at least two interruptions have been detected and it is then possible to determine the time between these two interruptions, the value of DT is correct and the processor 100 passes to step E207. If the variable Intc is equal to unity, only one interruption has been detected, the value of DT is incorrect since the value of the variable CPT1 used in the calculation at step E203 does not represent a previous rising edge or interruption, it is then not possible to determine the time between these two interruptions, and the processor 100 passes to step E240 of FIG. 2c.

At step E207, the processor 100 increments the variable Bitindex by one unit. The variable Bitindex varies between 0 and 27 and represents the number of bits of a demodulated frame.

At the following step E208, the processor 100 checks whether the variable DT lies between 3/4 of $T_{BIT}$ and 5/4 of $T_{BIT}$, where $T_{BIT}$ is the duration of a bit of the frame received.

In the modulation or Manchester coding, the duration between two falling edges is equal to a bit time or 1.5 bit times or two bit times depending on the consecutive bit values.

If the variable DT is between 3/4 of $T_{BIT}$ and 5/4 of $T_{BIT}$, the processor 100 passes to step E209. If not, the processor 100 passes to step E220 of FIG. 2b.

At step E209, the processor 100 sets the variable Cbit to a value of the variable Pbit. The value of the variable Cbit is the binary value of the bit being decoded and the value of the variable Pbit is the binary value of the previously decoded bit. The processor 100 stores the pair Cbit and Bitindex.

The processor 100 next passes to step E240 of the algorithm of FIG. 2c.

At step E210, the processor 100 interrupts the demodulation. The counting down between the predetermined value and the zero value is greater than the maximum time for receiving two frames. When the counter Ext reaches zero, at least one of the three frames has not been received.

At the following step E211, the processor 100 zeros the counter NOVFLW. This is because at least one bit has been correctly demodulated. The next interruption is awaited in order to relaunch the algorithm for the purpose of decoding at least one new binary value of the current frame.

At step E212, the processor 100 reinitialises all the variables used in the present algorithm and passes to the following step E211 already described.

At step E220 of FIG. 2b, the processor 100 checks whether the variable DT is between 5/4 of $T_{BIT}$ and 7/4 of $T_{BIT}$.

If the variable DT is between 5/4 of $T_{BIT}$ and 7/4 of $T_{BIT}$, the processor 100 passes to step E221. If not, the processor 100 passes to step E230 of FIG. 2c.

At step E221, the processor 100 checks whether the value of the variable Pbit is zero.

When the duration between two falling edges is equal to 1.5 bit durations, the duration represents the binary sequence 0 or 110.

If the value of the variable Pbit is zero, the processor 100 passes to step E222. If not, the processor 100 passes to step E223.

At step E222, the processor 100 sets the variable Cbit to the value 1. The processor 100 stores the pair Cbit and Bitindex and passes to step E240 of FIG. 2c.

At step E223, the processor 100 sets the variable Cbit to 1.

At the following step E224, the processor 100 sets the variable Nbit to zero. The value of the variable Nbit is the binary value of the bit that follows the bit Cbit in the frame currently being decoded.

At the following step E225, the processor 100 increments the variable Bitindex by one unit and stores the pair Nbit and Bitindex as well as the value of Cbit.

The processor 100 then passes to step E240 of FIG. 2c.

At step E230 of FIG. 2c, the processor 100 checks whether the variable DT is between 7/4 of $T_{BIT}$ and 9/4 of $T_{BIT}$.

If the variable DT is between 7/4 of $T_{BIT}$ and 9/4 of $T_{BIT}$, the processor 100 passes to step E231. If not, the processor 100 passes to step E235 of FIG. 2c.

At step E231, the processor 100 checks whether the value of the variable Pbit is zero.

When the duration between two falling edges is equal to 2 bit durations, the duration represents the binary sequence 010.

If the value of the variable Pbit is zero, the processor 100 passes to step E232. If not, the processor 100 passes to step E235.

At step E232, the processor 100 sets the variable Cbit to 1. The processor 100 stores the pair Cbit and Bitindex.

At this same step, the processor 100 sets the variable Pbit to zero.

At the following step E233, the processor 100 sets the variable Nbit to zero.

At the following step E234, the processor 100 increments the variable Bitindex by one unit and stores the pair Nbit and Bitindex.

At step E235, the processor 100 reinitialises all the variables used in the present algorithm and passes to the following step E240.

At step E240, the processor 100 checks whether the variable Bitindex is equal to 27.

If the variable Bitindex is equal to 27, the processor 100 passes to step E241. If not, the processor passes to step E244.

At step E241, the processor 100 interrupts the demodulation.

At the following step E242, the processor 100 sets the variable Bitindex to zero.

At step E243, the processor 100 notifies the control device that the frame has been correctly decoded and transfers, to the control device, the table consisting of all the values of the pairs Nbit and Bitindex stored. The table comprises all the demodulated binary values of a frame as well as the value of a frame counter representing the number of tables transferred from the previous reinitialisation of the present algorithm. At this same step, a new table similar to the one transferred to the control device is initialised and the frame counter is incremented.

At step E244, the processor 100 zeros the counter NOVFLW again.

Figure 3A:
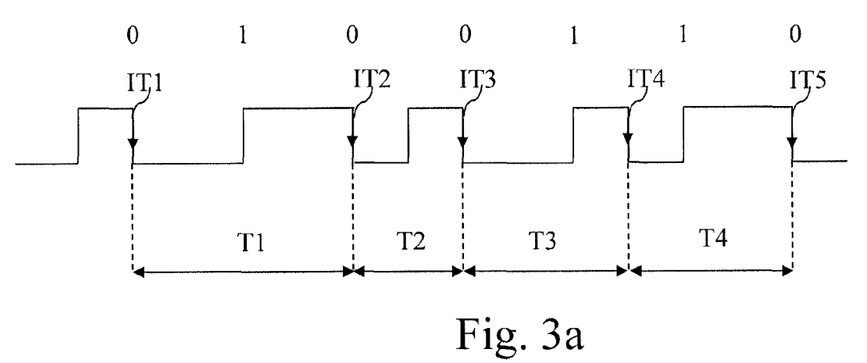
FIG. 3a depicts a first example of part of a bit frame received by the frame demodulation device according to the present invention.

FIG. 3a depicts a first example of a part of a bit frame received by the frame demodulation device according to the present invention.

In the example in FIG. 3a, a reduced sequence of seven bits is shown for reasons of simplification. As previously mentioned, a frame is composed of a binary sequence of 28 bits. The binary sequence 0100110 is modulated with the Manchester code.

At each falling edge, an interruption is triggered by the frame input module 108. The interruptions are denoted IT1, IT2, IT3, IT4 and IT5.

The processor 100 determines the time between each interruption and correctly demodulates the Manchester-coded binary sequence according to the time determined as described with reference to FIGS. 2a to 2c.

Figure 3B:
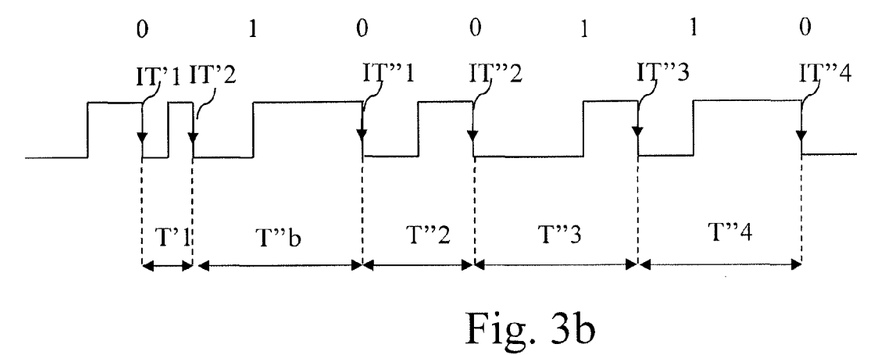
FIG. 3b depicts a second example of part of a bit frame received by the frame demodulation device according to the present invention.

FIG. 3b depicts a second example of a part of a bit frame received by the frame demodulation device according to the present invention.

In the second example embodiment, the frame received comprises the binary sequence 0100110 modulated according to the Manchester code and a parasitic pulse. At each falling edge, an interruption is triggered by the frame input module 108. The processor 100 determines the interval of time T'1 between the interruptions IT'1 and IT'2. The interval of time T'1 is less than $3/4 T_{BIT}$, the tests E208, E220 and E235 are negative and the processor 100 proceeds with a reinitialisation at step E235.

The processor 100 determines the time between each interruption IT"1, IT"2, IT"3 and IT"4 and decodes the Manchester-coded binary sequence 00110.

If the frame received is the first or second frame among the three frames, the processor 100 determines the time between the interruption IT"4 and the first interruption triggered on reception of the following frame. The time determined is greater than $9/4 T_{BIT}$, the tests E208, E220 and E235 are negative and the processor 10 proceeds with a reinitialisation at step E235.

If the frame received is the last frame among the three frames, the counter NOVFLW is greater than 1 and the test E201 is negative, and the processor 100 proceeds with a reinitialisation at step E212.

Naturally the present invention is in no way limited to the embodiments described here but quite the contrary encompasses any variant within the capability of a person skilled in the art and particularly the combination of the various embodiments of the present invention.

The invention claimed is:

1. A method for discriminating and demodulating a predetermined number of received frames, the frame consisting of a succession of a predetermined number of bits coded according to a Manchester code, wherein the frames are spaced apart by a predetermined period, the method comprises the steps of:
    generating an interruption at least at each appearance of a rising and/or falling edge of the frame of coded bits,
    determining the time between each interruption from at least one first counter,
    reinitialising the demodulation of the frame as soon as one of the determined times is less than a first predetermined value or greater than a second predetermined value, the first and second predetermined values being dependent on the duration of a bit coded according to the Manchester code,
    demodulating, for each determined time, if the determined time is greater than the first predetermined value and is less than the second predetermined value, at least one binary value of the frame from the determined time, and
    validating each frame received independently of the other frames.

2. The method according to claim 1, wherein the binary value determined is dependent on the binary value previously determined.

3. The method according claim 1, wherein the method further comprises the step of reinitialising the decoding of the frame if the value of the second counter is higher than the second predetermined threshold.

4. The method according to claim 1, wherein the method further comprises the steps of:
    storage of the received and validated frame, and
    reinitialisation of the demodulation.

5. The method according to claim 1, wherein the frames comprise a label or are numbered.

6. The method according to claim 1, wherein the method further comprises the steps of:
    initialisation of a second counter when the first interruption is launched,
    checking, at each interruption, whether the value of the second counter is equal to a third predetermined threshold, the third predetermined threshold representing a maximum time for the decoding of all the frames, and
    stopping the demodulation of the frame if the value of the second counter is greater than the third predetermined threshold.

7. The method according to claim 1, wherein the first counter is a cyclic counter asynchronous with the other counters, with a duration less than the duration of reception of the frames, and in that a third counter counts the number of times the capacity of the first counter is exceeded.

8. The method according to claim 7, wherein the third counter is reinitialised at each demodulation of at least one binary value.

9. The method according to claim 1, wherein each frame further comprises information for checking whether the bits of a decoded frame have been correctly decoded.

10. The method according to claim 1, wherein the edge is a falling edge.

11. A device for demodulating a predetermined number of received frames, each frame consisting of a succession of a predetermined number of bits coded according to a Manchester code, wherein the frames are spaced apart by a predetermined period, the device comprises circuitry causing the device to perform:
- generating an interruption at least at each appearance of a rising and/or falling edge of the frame of coded bits,
- determining the time between each interruption from at least one first counter,
- reinitialising variables used for the demodulation of the frame as soon as one of the times determined with the first counter is less than a first predetermined value or greater than a second predetermined value, the first and second predetermined values being dependent on the duration of a bit coded according to the Manchester code,
- demodulating, for each determined time, if the determined time is greater than the first predetermined value and is less than the second predetermined value, at least one binary value of the frame from the determined time and from a previously determined binary value, and
- validating each frame received independently of the other frames.

* * * * *